(12) United States Patent
Freeouf

(10) Patent No.: US 6,191,465 B1
(45) Date of Patent: Feb. 20, 2001

(54) SOLID STATE RADIATION DETECTOR

(76) Inventor: John Lawrence Freeouf, 27 E. Mountain, Katonah, NY (US) 10536

(*) Notice: Under 35 U.S.C. 154(b), the term of this patent shall be extended for 0 days.

(21) Appl. No.: 08/179,601

(22) Filed: Jan. 10, 1994

(51) Int. Cl.[7] .................................................. H01L 23/48
(52) U.S. Cl. ........................................ 257/458; 257/28
(58) Field of Search .................................. 257/458, 431, 257/28

(56) References Cited

U.S. PATENT DOCUMENTS

| | | | |
|---|---|---|---|
| 4,486,765 | * 12/1984 | Capasso | 257/458 |
| 4,751,201 | * 6/1988 | Nottenburg et al. | 257/458 |
| 4,785,186 | * 11/1988 | Street et al. | 257/430 |
| 4,839,714 | * 6/1989 | Doehler et al. | 257/28 |
| 4,891,521 | * 1/1990 | Danos | 257/428 |
| 4,917,474 | * 4/1990 | Yamazaki et al. | 350/333 |
| 4,947,223 | * 8/1990 | Biefeld et al. | 257/18 |

OTHER PUBLICATIONS

Alexiev et al, "High Purity Liquid Phase Epitaxial Gallium Arsenide Nuclear Radiation Detector," Nuclear Instruments and Methods in Physics Research, A317(1992), pp. 111–115.

McGregor et al, "Bulk GaAs Room Temperature Radiation Detectors", Nuclear Instruments and Methods in Physics Research, A322, (1992), pp. 487–492.

Ploog et al, "Simultaneous Modulation of Electron and Hole Conductivity in a New Periodic GaAs Doping Multilayer Structure", App. Phys. Lett. 38(11) Jun. 1, 1981 pp. 870–873.

Grüter et al., "Deposition of High Quality GaAs Films at Fast Rates in the LP–CVD System," Journal of Crystal Growth, 94(1989) pp. 607–612.

Ploog et al, "The Use of Si and Be Impurities for Novel Periodic Doping Structures in GaAs Grown by Molecular Beam Epitaxy", Journal of the Electro Chemical Society, vol. 128, No. 2 pp. 400–410.

Döhler et al, "Tunable Absorbtion Coefficient in GaAs Doping Superlattices", Physical Review B, vol. 25 No. 4, Feb. 15, 1982, pp. 2616–2626.

Wang et al, "Evaluation of $HgI_2$ Detectors for Lead Detection in Paint", IEEE Transactions on Nuclear Science, vol. 40 No. 4, Aug. 1993 pp. 846–850.

Conti et al, "Use of the EGS4 Monte Carlo Code to Evaluate the Response of $HgI_2$ and CoTe Detectors for Photons in the Diagnostic Energy Range", Nuclear Instruments and Methods in Physics Research, A322 (1992), pp. 591–595.

McGregor et al, "Development of Bulk GAAS Room Temperature Radiation Detectors", IEEE Transactions on Nuclear Science, vol. 39 No. 5, Oct. 1992 pp. 1226–1236.

Hazlett et al, "Large, High Resolution CdTe Gamma Ray Sensors", IEEE Transactions on Nuclear Science, vol. 33 No. 1 Feb. 1986 pp. 332–335.

* cited by examiner

*Primary Examiner*—Donald L. Monin, Jr.

(57) ABSTRACT

A radiation detection structural principle for improved detection wherein absorbtion members of high density and bandgap semiconductor material and meeting all efficiency limiting requirements are provided with a sweeping field applied across each member. The absorbtion members are assembled in stack structures for particular energy resolution benefits. The detector principle is extendable to long absorbtion paths and to energy resolution in specific areas.

12 Claims, 1 Drawing Sheet

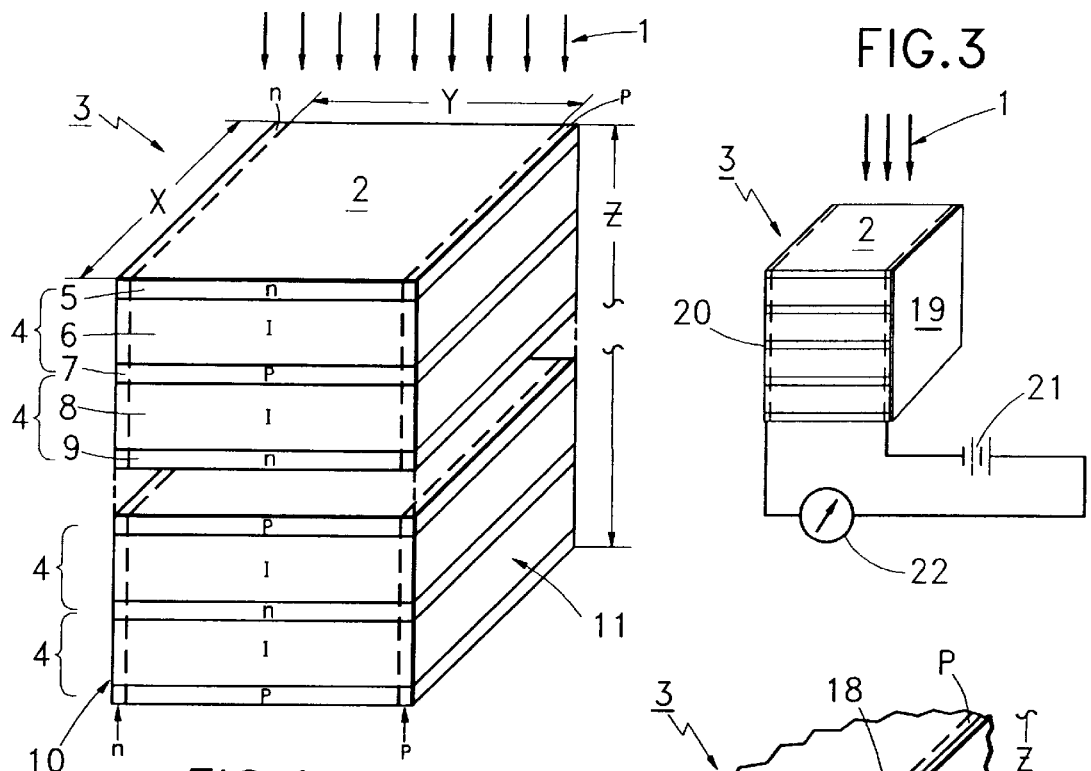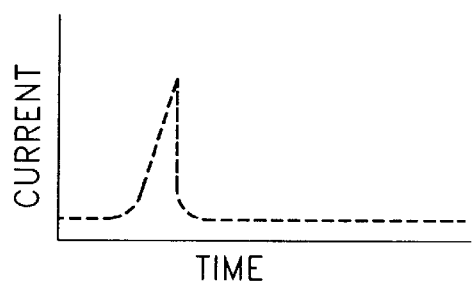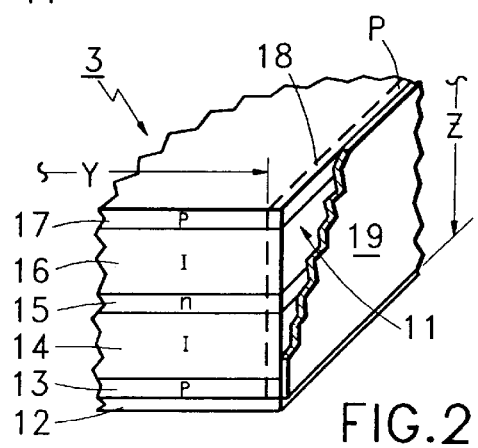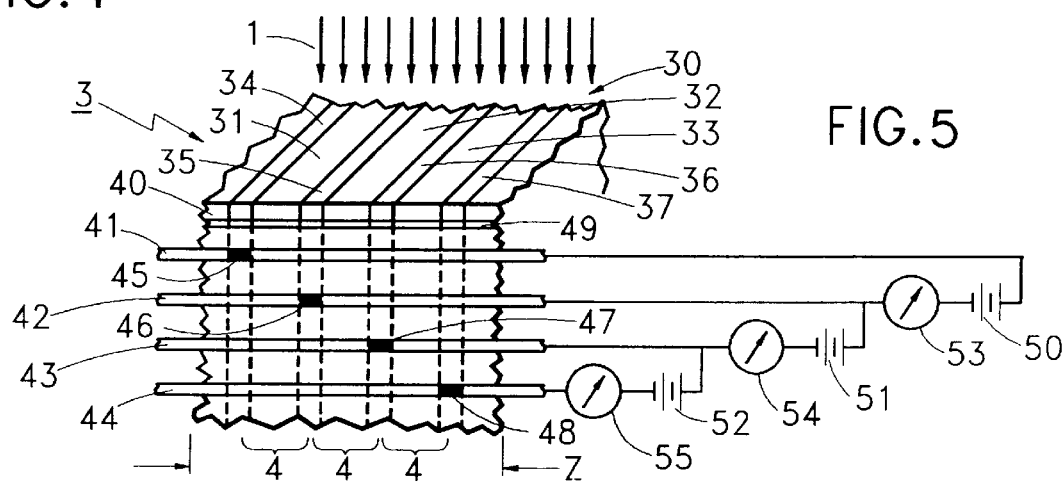

SOLID STATE RADIATION DETECTOR

FIELD OF THE INVENTION

The invention relates to the detection of the presence and extent of radiated atomic particles that are in rays of the Gamma, Alpha and X ray type and in particular to a radiation detector made of solid state materials and capable of operation in the 300 degree Kevin or room temperature range.

BACKGROUND AND RELATION TO THE PRIOR ART

In the detection, or sensing of the presence and extent of atomic particles, it has been the practice in the art to use solid state semiconductor structures that can produce a signal resulting from hole-electron pairs that result, when the atomic particles in passing through the semiconductor, engage in primary or secondary collisions. The hole-electron pairs are sensed by sweeping them into external contacts before they can recombine or be trapped.

There are several characteristics of radiation detection that result in special structural features in these devices. The propelling energy of the particles may be so great that relatively long distances may be required for absorbtion. The electron-hole pairs produced by an atomic particle collision must be distinguishable from any other carriers present due to any crystal imperfection or thermal carrier generation. Fields employed in sweeping the collision generated carriers into external contacts must be high due to the long absorbtion distances. The resulting charge is converted into a pulse, with the narrower the pulse, the better the time resolution and therefore a higher counting rate can be achieved. The total amount of charge in the pulse should be proportional to the energy of the exciting radiation. Thus, events that prevent extracting all of the charge within the pulse will degrade energy resolution.

In efforts to accommodate the needed features, the semiconductor structure generally has a large region, of intrinsic or semiinsulating conductivity, that is as depleted of carriers from any source other than an atomic particle collision, as the state of the technology will provide. In some cases several technological compromises are made.

In the case of the monoatomic semiconductors such as germanium and silicon since each has a relatively small band gap which produces more thermally generated carriers and limits the magnitude of any field applied across the absorbtion region for sweeping the collision produced carriers into the contacts, low, usually 77 degrees kelvin, liquid nitrogen temperatures are used to reduce thermally generated carriers. A requirement for such a low temperature in operation has a limiting effect on the places the device can be used. Recent efforts in the art have been in the use of the wider bandgap semiconductor material gallium arsenide in an effort to produce a radiation detector structure that can be operated in the 300 degree Kelvin or room temperature range. A serious limitation has been difficulty in producing thick enough and more perfectly crystalline absorbtion regions.

In an article by Alexiev et al. published in Nuclear Instruments & Methods in Physics Research A 317 (1992) Pages 111–115 there is reported the construction of room temperature radiation detectors of gallium arsenide wherein, using liquid phase epitaxial growth, 200 micro meter thick absorbtion regions are formed. The radiation enters the absorbtion region through a surface barrier rectifying contact.

Further efforts using the material GaAs are reported by Mc Gregor et al. published in Nuclear Instruments & Methods in Physics Research A 317 (1992) Pages 487–492, wherein detectors, using a Schottky barrier contact, and having absorbtion regions of increasing thicknesses of up to 250 micrometers, that were cut from pulled crystals, were found to exhibit decreasing resolution, as the thickness increased.

A need is developing in the radiation detector art for the ability to provide detector structures that operate at 300 degrees Kelvin and which have substantially greater thickness absorbtion regions without degrading energy resolution.

SUMMARY OF THE INVENTION

The invention provides a structural and processing principle in radiation detection in which, the long absorbtion distance required for atomic particle detection in rays such as X rays, Alpha rays and Gamma rays, is divided into a plurality of semiconductor absorbtion members with a sweeping field or bias impressed across the thickness of each. The absorption members are of high band gap and high density semiconductor material and are compatible with high quality growth capabilities. The principle of the invention is structurally implemented for high energy rays by providing, a stack of intrinsic or semiinsulating conductivity absorbtion layers that are relatively wide, about 100 micrometers or greater, each of high density, high band gap, semiconductor material. Each absorbtion member having on each side, a relatively thin, about 0.1 to 20 micrometers, thick conducting layer with external contacts.

BRIEF DESCRIPTION OF THE DRAWINGS

FIG. 1 is a perspective illustration of the detection portion of the solid state radiation detector of the invention.

FIG. 2 is a perspective view of a portion of the absorbtion and contacting layers illustrating crystal growth and contact features.

FIG. 3 is an electrical schematic drawing of the biasing, the connections and the energy resolution conversion of the invention.

FIG. 4 is a depiction of the type of signal observed by the detector of the invention when detecting a gamma ray collision event.

FIG. 5 is a perspective view of an embodiment of the invention employed as a position sensitive detector.

DESCRIPTION OF THE INVENTION

In accordance with the invention, the atomic particles of the radiation are absorbed in a plurality of relatively thick absorbtion members. Each absorbtion layer is made up of a preferably monocrystalline, high density, high band gap, semiconductor material that is depleted of conduction carriers and has a relatively thin conductive layer on each side for external contact.

In one type of construction the relatively thin conductive layers are made up of a layer of one conductivity type on one side of the absorbtion layer and a layer of the opposite conductivity type on the other side of the absorbtion layer.

In another type of construction the thin layers are of a metal. The thin conductive layers, under bias, impress a carrier sweeping field across the depleted absorbtion layer for any carriers that are the result of a collision event by an atomic particle.

In one embodiment, there are as many absorption members, serially positioned as a stack, along the absorbtion path, as are needed to provide the long absorbtion distance required for atomic particles in the rays.

In another embodiment the absorbtion members are positioned in parallel along the absorbtion path with each absorbtion member providing a defined area to the radiation.

In the p and n conductive layer type of construction external contacts to the conductive layers is provided by producing, through diffusion, bombardment or epitaxy, a surface region adjacent one side of the stack, of one conductivity type, and a surface region of the opposite conductivity type on the opposite side of the stack. Metal contacting coatings are placed over the opposing conductivity type surface regions on the sides. In the metal layer type of construction, contact is made through lithographically positioned conductors over an insulating layer on the side of the stack with a via through the insulating layer to the specific layer being contacted as is standard practice in the art.

The invention is illustrated in FIG. 1 with the type of construction where the relatively thick absorbtion layers are monocrystalline and the relatively thin conductive layers are p and n epitaxial layers in an embodiment where the stack is oriented along the absorbtion path.

Referring to FIG. 1, the radiation 1, depicted as arrows, impinges on the surface 2, in the area defined by dimensions X and Y, of a multilayer stack made up of a series of monocrystalline absorbtion members 4, each in turn made up of a relatively thin particular conductivity type extrinsic conducting layer 5 that is epitaxial with a relatively wide intrinsic or semiinsulating conductivity absorbtion layer 6 that is epitaxial with another relatively thin extrinsic conducting layer 7 of opposite conductivity type to that of layer 5. For clarity of explanation purposes the designations n and p respectively are assigned to layers 5 and 7. The element designation 4 for each absorbtion member is indicated along the entire stack 3. The stack 3 is shown with a break to illustrate that as many layers as may be needed to absorb high energy particles may be employed in an overall absorbtion path dimension 2. In two adjacent absorbtion members 4 made up of layers 5, 6, 7, 8, and 9, the common conducting layer 7 serves both the layers 6 and 8.

In FIG. 1, the contacting of the n and p layers is accomplished, by introducing an appropriate conductivity type determining dopant into surface regions of the stack 3, each shown with a dotted line, through the sides 10 and 11, only side 11 being visible in this Figure. The n type dopant is assigned for explanation purposes to be introduced through side 10 and the p type through side 11. The introduction is performed using techniques such as diffusion, bombardment or epitaxy. The n dopant forms a low resistance ohmic contact to all n type conducting layers, a junction with all high resistance intrinsic absorbtion members and a high resistance p n junction to all p type conductive layers. Similarly, the p dopant forms an ohmic contact to p type layers, a junction with high resistance intrinsic absorbtion layers and a p n junction to n type layers. A layer of metal, not shown in this Figure, is placed over the sides 10 and 11 to facilitate external electrical contact.

Referring next to FIG. 2 there is shown a perspective view of a portion of the detector in fabrication. In FIG. 2 the layers, with an area of the order of the area defined by the dimensions X and Y of FIG. 1 are preferably serially grown using the growth conditions that produce the highest quality monocrystalline semiconductor material. On an epitaxially compatible substrate 12 a first, for example p, conductive layer 13 is epitaxially grown on substrate 12 with thickness and doping density specifications to ensure high conductivity which would for example be a thickness in the range of about 0.1 to 20 micrometers doped to about $10^{19}$ atoms/cc.

An absorption layer 14 is then epitaxially grown on the layer 13, with compensated doping, to produce a relatively thick layer, of the order of 100 micrometers or greater. The layer 14 is of intrinsic or semiinsulating conductivity of the order of 10 ohm/cm resistivity. An n conductivity type conductive layer 15 is next epitaxially grown on the layer 14 again to a thickness in a range of about 0.1 to 20 micrometers at a doping density of about $10^{19}$ atoms/cc. On the layer 15 another absorbtion layer 16 is epitaxially grown on the layer 15 to a thickness and with a resistivity of the layer 14. A p conductivity type layer 17 is next grown epitaxially on the layer 16 with the thickness and doping density specifications of the layer 13. Thereafter, the layer growth operations would be continued with the same specifications and in the same order until the absorbtion path dimension Z of FIG. 1 is achieved for the particular application where the detector is to be used.

Continuing, with respect to FIG. 2, contacting is accomplished by introducing a particular conductivity type determining dopant into the regions adjacent opposite sides to form ohmic contacts to conducting layers of the same conductivity type, junctions with the high resistance intrinsic absorbtion layers and p n junctions to the conducting layers of the opposite conductivity type. The dopant introduction is for example by diffusion, bombardment or epitaxy on the opposite side. This is illustrated in FIG. 2 as the dopant concentration through side 11 producing for example p region 18 between the surface of side 11 and the dotted line. The p region 18 forms an ohmic contact with p conducting layers 13 and 17, a junction with high resistance intrinsic absorbtion layers 14 and 16 and a high resistance p n junction with the n conducting layer 15. The same dopant introduction operation would be done through opposite side 10, not visible in this figure, using the n type dopant which would form an ohmic contact to the layer 15, a junction to the layers 14 and 16 and a p n junction to the layers 13 and 17. The conductivity conversion in the region 18 reduces the Y dimension in FIG. 1 however the conversion processes such as diffusion, bombardment and epitaxy are very precise, so that exact X-Y area values needed to determine radiation dosages, are readily obtained. The contacting is completed with a layer of metal 19 applied over the surface of each opposite side with the layer 19 for side 11 and a layer 20 for side 10, not visible in this figure, for external electrical contacts.

Referring to FIG. 3 the electrical connections for biasing and signal detection are shown in which a power source 21 connected between metal layers 19 and 20 impress about a 10 volt potential difference across each absorbtion layer providing thereby a sweeping field in each absorbtion layer for sweeping carriers, resulting from atomic particle produced collisions, into the external circuitry. A signal sensor and recorder 22, capable of responding to signals of the time duration of atomic particle collision events, is connected in the external circuitry. The sensor and recorder element 22 is a device known in the art as a charge sensitive amplifier and a pulse height analyser combination wherein the amount of charge which is proportional to the energy of exciting radiation, is recorded. Charge sensitive amplifiers and pulse height analysers are standard components in the art. An example of a sensor and recorder combination would be a model 244 amplifier manufactured by the Tennelec Corporation and a PCA card for a personal computer manufactured by the Nucleus Personal Computer Analyzer Co.

A depiction of an example signal is shown in FIG. 4 wherein the result of an atomic particle collision event is a pulse with a substantial current excursion that occurs over a very short duration of about 10 nanoseconds.

In providing a starting place for one skilled in the art in practicing the invention, while there are considerable variations between and within particular materials, the following discussion should produce a perspective.

The material chosen for the semiconductor material should have a high density to increase the probability of an atomic particle producing a collision event as the atomic particle passes through the material; it should have a large band gap to reduce thermally generated carriers and to permit stronger sweeping fields or bias to be applied; and, since it is essential that there be a minimum of carrier trapping crystal defects and at this state of the art the most defect free semiconductor material is epitaxially grown, it is of benefit that it be susceptible to high quality epitaxial crystal growth. While non-crystalline semiconductor material such as the amorphous type is of lower quality, it is typically less expensive, and useful in some applications. It facilitates the use of metal conduction layers. The material however could be expected to have reduced transport properties and greater losses.

In table 1 there is listed five compound semiconductor materials with high density and large band gaps. It is noted that there does not appear to be any linear relationship between density and band gap, all are reported in the literature as being susceptible to high quality epitaxial crystal growth.

TABLE 1

| Compound | Density | Band Gap |
|---|---|---|
| $HgI_2$ | 6.4 gm/cm$^3$ | 2.13 Electron volts |
| CdTe | 6.2 gm/cm$^3$ | 1.44 Electron volts |
| GaAs | 5.3 gm/cm$^3$ | 1.43 Electron volts |
| InP | 4.78 gm/cm$^3$ | 1.35 Electron volts |
| GaP | 4.13 gm/cm$^3$ | 2.24 Electron volts |

The material GaAs, with a density of 5.3 gm/cm$^3$, a band gap of 1.43 electron volts and with a well reported susceptibility to molecular beam epitaxial growth and chemical vapor epitaxial growth into high quality semiconductor crystals is the preferred embodiment material for the monocrystalline layers in the structure.

The dopants would be Be, as the p dopant, and Si, as the n dopant. The substrate 12 in FIG. 2 would be a GaAs crystal wafer with the growth surface having [1 0 0] crystallographic orientation. All p and n conducting layers would be as thin as possible while being highly conductive. The thickness would be about 20 micrometers at a doping level of $10^{17}$ to $10^{19}$ atoms/cm$^3$. All I absorbtion layers would be of high quality crystal material with mobilities of 100,000 cm$^2$/Volt Sec, each would have about a $10^7$ ohm/cm resistivity which involves a carrier concentration of about $10^7$/cm$^3$. A thickness of 3 millimeters will provide a high resolution detector for all but the most powerful gamma rays. The thickness would be as thick as growth techniques for quality material and the strength of the biasing field would permit. Dimensionally the thickness would typically be at least 100 micrometers or thicker. At that thickness a 10 volt bias across the I layer would provide a 1000 volt/cm sweeping field. Growth, employing a Ga—HCl—AsH$_3$—H$_2$ chemical vapor growth process with low pressure in the zone of the growing crystal can proceed at rates of 300 micrometers per hour and could be continued for several centimeters with conductive layer doping, where desired.

A number of variations will become apparent to one skilled in the art in particular applications. As examples, in applications where the X-Y area dimensions are not rigorous contacting can be by "reach through" and "beveling of the side" techniques; further the conducting layers can be made of metal in applications where the conducting layers are not needed as part of the growth process, still further a single absorbtion layer could be used where the layer thickness is sufficient for the energy of the ray involved.

The principle of the invention of the use of absorbtion layers with a sweeping field impressed across the thickness dimension of each absorbtion layer is applied in another embodiment where multiple layers are in a stack oriented parallel to the incident radiation to produce a one dimensional position sensitive detector as illustrated in connection with FIG. 5.

Referring to FIG. 5 a perspective view of the invention is shown in which the radiation is incident parallel to the monocrystalline absorbtion layers, separate contact is made to each conducting layer and separate bias and charge sensing for each absorbtion layer is provided. The structure of FIG. 5 can measure charge in each individual layer so that there is resolution of all the radiation incident to the exposed area of that layer.

In FIG. 5, using the same reference numerals for like elements as the other figures, the radiation 1 impinges on a side 30 which has the monocrystalline absorbtion layers 31–33 in a stack 3. The atomic particles are absorbed in a path that includes the full length of the absorbtion layers 31–33 a portion of which are shown in this figure. The sweeping field or bias is impressed across the thickness of each absorbtion layer 31–33 between conductive layers 34–37. The absorbtion layers 31–33 can be grown monocrystalline wafers diced to sizes as large as the absorbtion path of the rays to be detected requires, which could be several centimeters. The conductive layers of which 34–37 are shown can be of the thin metal type of construction as illustrated or the p and n epitaxial layer type of construction as described in connection with FIGS. 1 and 2. The thin metal layers 34–37 are of for example 10 micrometer layers of aluminum. Contact is made on a side 40 where separate conductors 41–44 each individually contact layers 34–37 respectively through vias 45–48 that go through insulator 49 at the intersection of the conductor and the layer. The contacting is done using standard lithographic etching and deposition techniques used in the art. The individual absorbtion layers 31, 32 and 33 each are provided with a separate bias 50, 51 and 52 and a separate charge sensor and recorder 53, 54 and 55 connected between conductors 41 and 42, 42 and 43 and 43 and 44 respectively.

In the structure of FIG. 5 one coordinate of the radiation is established to the thickness of the absorbtion layer 31, 32 or 33 which is of the order of 100 micrometers and all radiation within the layer is analysed. The length of the absorbtion path or size of the absorbtion depth is the selected size of the portion of the wafer on which the growth took place. The contacting layers 34–37 in long absorbtion depth structures must be thick enough that they do not become resistive over the long length.

TECHNICAL APPLICATION

The structural principles of the invention addresses many interrelated aspects of radiation detection. As knowledge of the nature of the radiation is being accumulated, the length of the absorbtion path along the dimension Z of FIG. 1 required for the various applications will vary from a minimum of about 300 micrometers for a medical imaging application where minimal energy is involved to a possible several centimeters for the energy in high energy gamma rays. The capability of being able to form a stack of absorbtion members, each member of which is highly efficient and the number of members can be continued until the needed absorbtion path length is reached permits high quality detection over a wide range of applications. The invention also permits the area, from dimensions X and Y of FIG. 1 to vary from a minimum of the size of a pixel, where many detectors are used in an image array as in a medical application, to a, at present view, maximum of about a square centimeter for gamma ray measurement. The separate absorbtion member construction permits taking advantage of new materials, improved crystal growth techniques and varying field strengths as the art progresses. The structure of FIG. 5 provides the ability to analyse precise areas of radiation and to be able to have absorbtion paths the size of the diameter of a wafer.

What has been described is a radiation detection structural principle for improved detection wherein absorbtion members of high density and bandgap semiconductor material with a sweeping field applied across each layer are assembled with an absorbtion distance in accordance with the ray energy.

What is claimed is:

1. A radiation detector comprising:

a plurality of planar absorbtion members arranged in a stack having a surface made up of the edges of said absorbtion members, each said absorbtion member having at least one terminating edge exposed in a surface of said stack, each said absorbtion member further having a center layer of high density, high band gap, semiconductor material that is intrinsic, and has a selected thickness dimension, a first highly conductive contacting layer of only one of a high extrinsic conductivity semiconductor material and a metal, said first contacting layer being contiguous with a first surface of said intrinsic layer, coextensive with said intrinsic layer, and having a thickness that is small relative to said selected thickness of said intrinsic layer, and, a second highly conductive contacting layer of only one of a high extrinsic conductivity semiconductor material and a metal, said second contacting layer being contiguous with a second and opposite surface of said intrinsic layer, coextensive with said intrinsic layer, and has a thickness that is small relative to said selected thickness of said intrinsic layer, and, an electrical bias applied between said first and said second contacting layers, in a magnitude related to said bandgap, the carrier density and said thickness dimension of said intrinsic layer, of a magnitude sufficient for essentially full charge extraction.

2. The radiation detector of claim 1 wherein all said at least one absorbtion members are in a is monocrystalline structure.

3. The radiation detector of claim 2 wherein said at least one absorbtion member with said bias is a plurality of said biased absorbtion members arranged in a stack serially along the absorbtion path of said incident radiation.

4. The radiation detector of claim 2 wherein said at least one intrinsic layer with said bias is a plurality of said biased layers arranged in a stack in parallel to the absorbtion path of said incident radiation.

5. A radiation detector comprising:

a plurality of planar absorbtion members arranged in a stack having a surface made up of the edges of said absorbtion members positioned perpendicular to the direction of an incident radiation, each said absorbtion member having at least one terminating edge exposed in a surface of said stack parallel to said direction of said incident radiation each said absorbtion member further having a center layer of high density, high band gap, semiconductor material that is intrinsic, and has a selected thickness, a first highly conductive contacting layer of only one of a high extrinsic conductivity semiconductor material and a metal, said first contacting layer being contiguous with a first surface of said intrinsic layer, coextensive with said intrinsic layer, and having a thickness that is small relative to said selected thickness of said intrinsic layer, and, a second highly conductive contacting layer of only one of a high extrinsic conductivity semiconductor material and a metal, said second contacting layer being contiguous with a second and opposite surface of said intrinsic layer, coextensive with said intrinsic layer, and has a thickness that is small relative to said selected thickness of said intrinsic layer, a layer of insulating material on said surface of said stack with said exposed terminating edges, a raster of parallel conductors on said layer of insulating material each with a via through said insulating material to one said edge of one said conducting layer, said vias being positioned diagonally along said insulating material covered terminating edge surface of said stack whereby contacts to the contacting layers of each said absorbtion member are to adjacent parallel conductors.

6. The radiation detector of claim 1 including, charge sensitive amplification and pulse height analysis excitation signal processing connected for detection of a atomic particle collision events in each said absorbtion layer.

7. The radiation detector of claim 1 wherein said magnitude of said bias is about 10 volts.

8. Radiation detection from an incident direction comprising:

a plurality of planar absorbtion members arranged in a stack having a surface made up of the edges of said absorbtion members, each said absorbtion member having at least one terminating edge exposed in a surface of said stack, each said absorbtion member further having a center layer of high density, high band gap, semiconductor material that is intrinsic, and has a selected thickness dimension, a first highly conductive contacting layer of only one of a high extrinsic conductivity semiconductor material and a metal, said first contacting layer being contiguous with a first surface of said intrinsic layer, coextensive with said intrinsic layer, and having a thickness that is small relative to said selected thickness of said intrinsic layer, and, a second highly conductive contacting layer of only one of a high extrinsic conductivity semiconductor material and a metal, said second contacting layer being contiguous with a second and opposite surface of said intrinsic layer, coextensive with said intrinsic layer, and has a thickness that is small relative to said selected thickness of said intrinsic layer, and, an electrical bias applied between said first and said second contacting layers, in a magnitude related to said bandgap, the carrier density and said thickness dimension of said intrinsic layer, of a magnitude sufficient for essentially full charge extraction.

9. The radiation detector of claim 8 including, charge sensitive amplification and pulse height analysis excitation signal processing connected for detection of a atomic particle collision events in each said absorbtion layer.

10. The radiation detection of claim 8 wherein said semiconductor material is a compound taken from the group of $HgI_2$, CdTe, GaAs, InP, and GaP.

11. The radiation detection of claim 8 wherein said intrinsic layer thickness is parallel to said incident radiation direction surface.

12. The radiation detection of claim 8 wherein said intrinsic layer thickness is perpendicular to said incident radiation direction.

* * * * *